United States Patent [19]

Chen et al.

[11] Patent Number: 5,671,185

[45] Date of Patent: Sep. 23, 1997

[54] APPARATUS FOR REPLACING DEFECTIVE CELLS IN A MEMORY DEVICE

[75] Inventors: Wei Chen, Taipei; Tung Chi Chang, Hsin-Chu, both of Taiwan

[73] Assignee: United Microelectronics Corporation, China

[21] Appl. No.: 614,386

[22] Filed: Mar. 12, 1996

[51] Int. Cl.$^6$ .................................................. G11C 8/00
[52] U.S. Cl. .................. 365/200; 365/230.06; 365/225.7
[58] Field of Search .............................. 365/200, 230.06, 365/230.03, 225.7

[56] References Cited

U.S. PATENT DOCUMENTS 5,473,573  12/1995  Rao ........................................ 365/200
5,475,648  12/1995  Fujiwara ................................ 365/200

*Primary Examiner*—David C. Nelms
*Assistant Examiner*—Vu A. Le

*Attorney, Agent, or Firm*—Barnes, Kisselle, Raisch, Choate, Whittemore & Hulbert, P.C.

[57] ABSTRACT

A method and apparatus for effecting repair or replacement of defective circuits in a solid state memory chip includes locating all the spare cells on one block. A circuit for switching redundancy spare cells in place of main wordline cells includes a first portion for providing a first output whenever both inputs are present and a second output at all other times, the first input that is always present and a second input that is present whenever repair is not selected, a second portion having a first input connected to the output of the first portion and a second input that is absent when repair is indicated, the second portion having a first output whenever one of the inputs is present and a second output whenever neither input is present, a third portion connected to the output of the first portion through a circuit that inverts the value of the output from the first portion and a second input that is present when repair is indicated, the third portion producing a first output whenever both inputs are present and a second output at all other times.

9 Claims, 2 Drawing Sheets

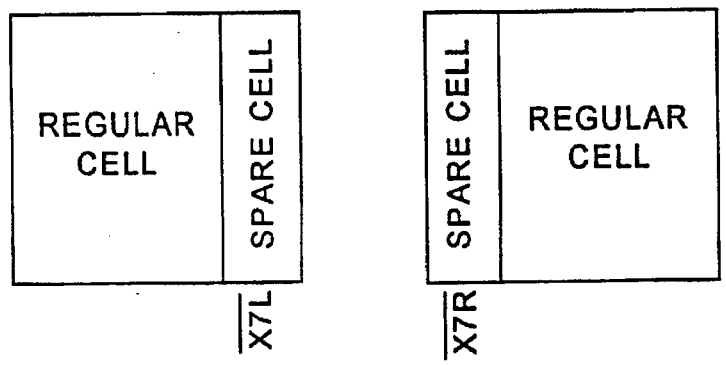
(PRIOR ART)
FIG. 1
X7 - PREDECODER:
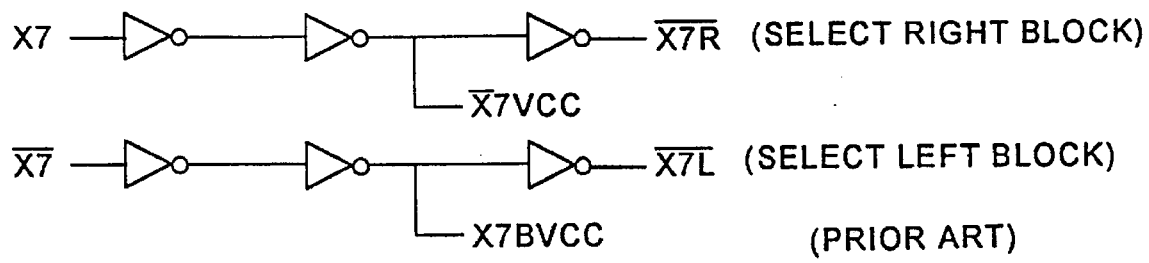
(PRIOR ART)
FIG. 2
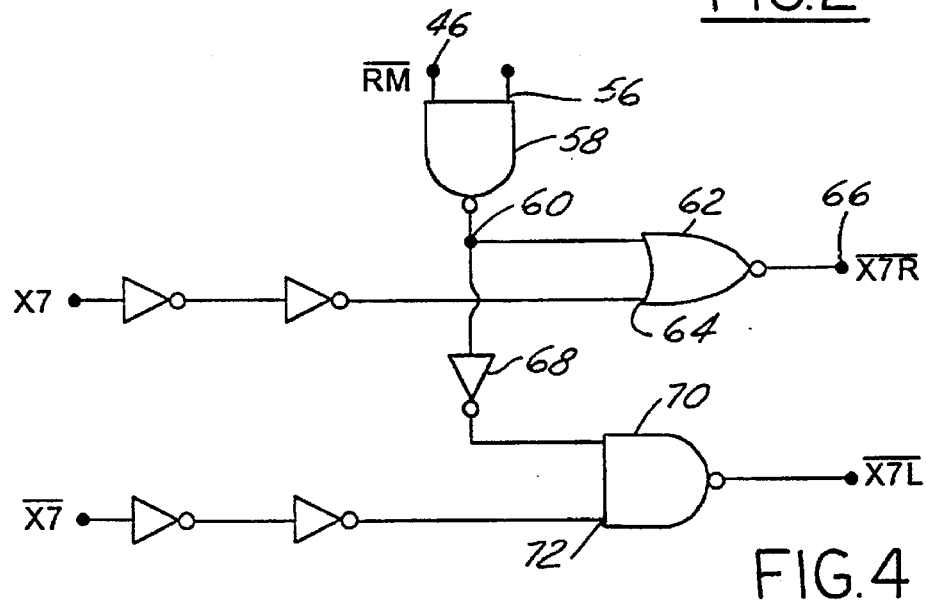
FIG. 4
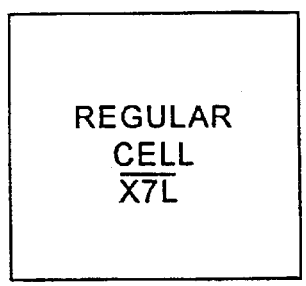
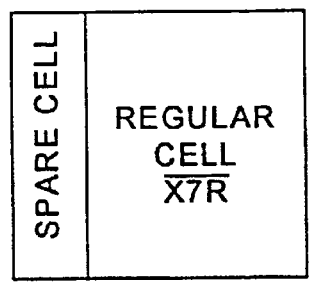
FIG. 5

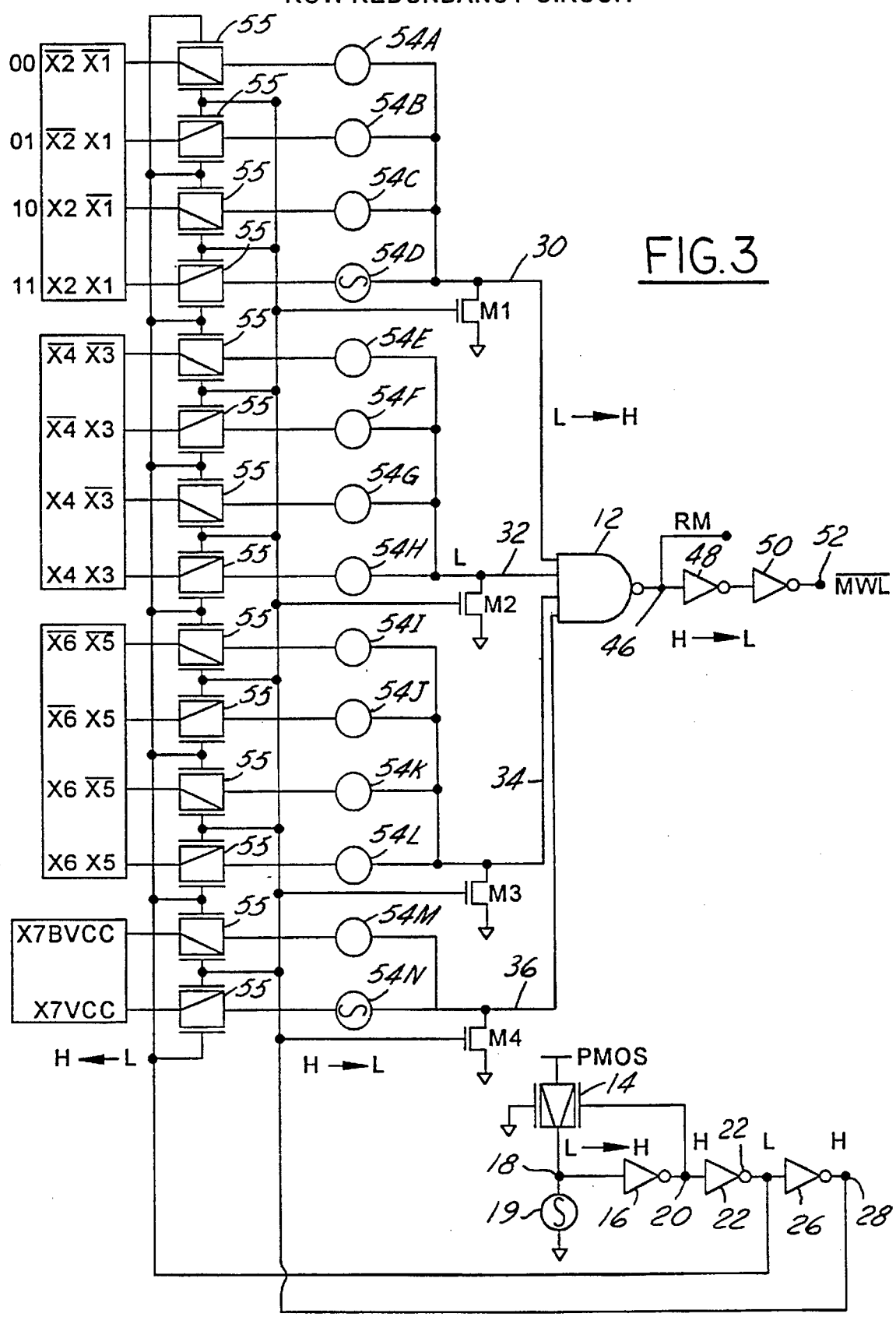

APPARATUS FOR REPLACING DEFECTIVE CELLS IN A MEMORY DEVICE

FIELD OF THE INVENTION

The present invention pertains to solid state memory chip repair and more particularly to circuits for switching in spare memory cells when defective cells have been located.

BACKGROUND OF THE INVENTION

Static random access memory devices (SRAM) have been used broadly in recent years in computer or other electronics applications. In a SRAM, the information is not stored in the form of charges in a capacitor such as that in a DRAM, but instead held in the state of a so-called flip-flop. The flip-flop has two stable states that can be switched by a strong external signal. The cell structure of a SRAM is far more complicated than that of a DRAM memory cell. While a DRAM cell consists only of an access transistor and a capacitor holding the charges according to the stored data, in a typical SRAM cell, there are two access transistors and a flip-flop with two memory transistors as well as two load elements in the circuit. The integration of a SRAM memory cell is only possible with a higher technical effort. SRAM chips are more expensive and usually have less storage capacity then DRAM chips. The SRAM chips are therefore mainly used for fast and small cache memories while DRAM chips for the large and slow main memory. High quality SRAM chips for fast-clocked RISC machines or supercomputers achieve access times of no more than 12–20 ns. This is compared to a normal chip used in a PC with access times of 20–35 ns.

In an SRAM chip, the unit memory cells are arranged in a matrix of rows and columns, which are selected by a row and column decoder, respectively. Similar to a DRAM, the gate of the access transistors are connected to the wordline and the sources are connected to the bit line pair. When data is to be read from an SRAM memory cell, the row decoder activates the corresponding wordline. The two access transistors turned on and connect the memory flip-flop with the bit line pair BL, BL. This is shown in FIG. 1. The two outputs Q and $\underline{Q}$ of the flip-flop are connected to the bit lines, and the signals are transmitted to the sense amplifier at the end of the bit line pair. Unlike a DRAM, these two memory transistors $Tr_s$ in the flip-flop provide a very strong signal as they are amplifying elements on their own. The sense amplifier amplifies the potential difference on the bit line pair BL, BL. Because of the large potential difference, the amplifying process is carried out much faster than in a DRAM, so that the SRAM chip meets the column address much earlier if the access time is not to be degraded. SRAM chips therefore do not carry out multiplexing of row and column addresses. Instead the row and column address signals are provided simultaneously. The SRAM divides the address into a row and column part internally. After stabilization of the data, the column decoder selects the corresponding column and outputs a data signal to the data output buffer and thus to the external circuitry.

In the design of an SRAM memory cell, redundancy circuits are frequently used for the repair of the failed main wordline cells. Conventionally, each block of memory cells utilizes its own redundancy circuit independently. However, when the total number of the failed main wordline cells exceeds the number of redundancy circuits supplied for repair purpose in any one block of the memory cell, the memory cell chip cannot be repaired.

It is therefore an object of the present invention to provide an improved SRAM wordline structure that can be easily repaired by utilizing redundancy circuits.

It is another object of the present invention to provide an improved SRAM wordline structure than can be repaired by relocating all the redundancy circuits to one block such that the chip size can be reduced and the repair yield can be increased.

SUMMARY OF THE INVENTION

The present invention provides a method and apparatus for effecting repair or replacement of defective circuits in a solid state memory chip includes locating all the spare cells on one block. Included in the method and apparatus for effecting repair of defective circuits is a circuit for switching redundancy spare cells in place of main wordline cells. This circuit includes three portions, each having a constant input and a varying input that controls the replacement of circuits. A first portion is for providing a first output whenever both inputs are present and a second output at all other times, the first input that is always present and a second input that is present whenever repair is not selected. In this circuit, both inputs are present when there are no problems and the designed main wordline is operational. This portion can be accomplished by a NAND gate. A second portion is provided that has a first input connected to the output of the first portion and a second input that is always absent, the second portion having a first output whenever one of the inputs is present and a second output whenever neither input is present. In this portion, the steady state or state when no problems are present is when a first output is being provided by the first portion. When this occurs, the second portion provides the second output. This can be accomplished by a NOR gate. A third portion is provided that has one input connected to the output of the first portion through a circuit that inverts the value of the output from the first portion and a second input that is always present. The third portion produces a first output whenever both inputs are present and a second output at all other times. In this circuit, the stead state is the first output and the designed mainline word is selected. This portion can be achieved by a NAND gate.

When a defect is found during testing, the circuit operates to change one of the inputs to the first portion, which changes its output to the second output. This changes the input to the second portion which changes its output to select redundancy cells. At the same time, the output from the third portion changes so that the designed mainline word is not selected.

BRIEF DESCRIPTION OF THE DRAWINGS

Other objects, features and advantages of the present invention will become apparent upon consideration of the specification and the appended drawings, in which:

FIG. 1 are illustrations of the prior art SRAM cells having redundancy circuits.

FIG. 2 is a circuit diagram illustrating the selection method for the prior art SRAM cells.

FIG. 3 is a circuit diagram illustrating a row redundancy circuit for an SRAM cell.

FIG. 4 is a circuit diagram illustrating the selection method according to the present invention method.

FIG. 5 are the present invention SRAM cells having all redundancy circuits installed in one block corresponding to that shown in FIG. 1.

DETAILED DESCRIPTION OF THE PREFERRED EMBODIMENT

The present invention discloses a new method and apparatus for a wordline structure in a static random access memory that incorporates a built in redundancy circuit for repair or replacement of defective circuits. In the present invention, all redundancy circuits are located in a single block of an integrated circuit chip. By locating all redundancy circuits in one block, the chip size can be reduced by eliminating certain repeated portions of the testing. Through the use of logic circuits, the defective main wordline cells in either block may use the spare main wordline cells or redundancy circuits for replacement.

In manufacturing integrated circuits, because of their size and complex nature, a certain percentage of memory cells may prove defective. In order to compensate for the possible defects, extra or spare memory cells are designed into the chip. The memory cells are tested to determine their reliability and any cells that are less than reliable are replaced by spare or reliable cells. Occasionally, the number of defective cells exceed the number of spare cells available and the chip must be scrapped. However, the number of chips that must be scrapped amounts to a small percentage of the total manufactured.

On a SRAM chip, (static random access memory chip), memory cells are arranged in blocks of memory cells, each having its own set of spare cells as illustrated in FIG. 1. With this type of arrangement the circuits for shifting between primary cells that have proven defective and good spare cells is illustrated in FIG. 2.

In the design of RAM (random access memory) semiconductor chips, redundancy circuits are frequently used to repair failed main wordline circuits. FIG. 2 illustrates typical X7-predecoder circuits for the selection of repair circuits on the right block, comprised of inverters 8R, 9R, and 10R and the selection of repair circuits on the left block, comprised of inverters 8L, 9L and 10L. Whatever signal is present at the input to inverter 8R or 8L, the inverse signal, either high or low, will be present at the output of inverter 10R or 10L, respectively. Inverters 8R and 8L change a high to a low and a low to a high, in this case signals X7 and $\overline{X7}$. Invertors 9R and 9L change the low output of invertors 8R and 8L back to a high or the high output of invertors 8R and 8L back to a low. Invertors 10R and 10L change the low output of invertors 9R and 9L back to a high or the high output of inverters 9R and 9L back to a low. In other words, the combination of inverter 8R, inverter 9R and inverter 10R and the combination of inverter 8L, inverter 9L and inverter 10L provide an inverse amplified output of an input signal.

Referring now to FIG. 3, a schematic diagram of a row redundancy circuit such as that used in the present invention is illustrated. Four groups are illustrated as feeding NAND gate 12. The first group has four possible inputs, not X2 and not X1, not X2 and X1, X2 and not X1, and X2 and X1. Similarly, the next two groups have identical arrangements for X4 and X3, and for X6 and X5. The final group has only two possible inputs, X7BVa and X7Va. Under normal operating conditions, a main wordline (MWL) is selected. When a main wordline is selected, the output of PMOS 14 (P type channel metal oxide silicon), which feeds inverter 16 at node 18 an disconnected to ground through fuse 19, is low (L) or zero. Inverter 16 outputs a high (H) or one to node 20, the input to inverter 22 and the source for PMOS 14. The output of inverter 22, node 24 is low. This is the input for inverter 26, which then produces a high or one at node 28. Thus, the channel for P/N MOS devices 30, 32, 34 and 36 are all high and their transmission gates 38, 40, 42 and 44, respectively, are all low or zero. All four inputs to NAND gate 12 are low so the output to node 46 is high. A low is produced at the output of inverter 48, which is the input to inverter 50, which produces a high or one at node 52. Thus, MWL is high and selected and the MWL of the redundancy circuit is off.

If defective circuits have been located, main wordline repair is selected. When this occurs, fuse 19 is blown or burned out to change the value at node 18, the output of PMOS 14, is high, because of the operating of inverters 16, 22 and 26, node 20 becomes low, node 24 becomes high and node 28 becomes low. The channel for P/N MOS devices 30, 32, 34 and 36 are all low and their transmission gates 38, 40, 42 and 44, respectively, are all become high or are turned on. Fuses 54A through 54M of any unselected predecoder outputs are burned out. All four inputs to NAND gate 12 are high so the output to node 46 is low. Through the operation of inverters 48 and 50, a low is produced at node 52. Thus, MWL is low and RM, at node 46, is low which is the condition when wordline repair is selected.

The use of the repair structure is best illustrated in FIG. 4, a schematic diagram of the circuit of the present invention. In the present invention, all spare circuits are placed in one block on the integrated circuit chip. FIG. 5 illustrates the preferred arrangement of spare cells. In this figure, the spare cells are all located on the right block, identified as X7R with some cells of first choice located on the left block identified as $\overline{X7L}$. These blocks may be interchanged, with all the spare cells located on the left block, as long as all spare cells are located on one block. The circuitry of FIG. 4 is described with all spare cells located on block $\overline{X7R}$.

As stated previously, under normal operation $\overline{MWL}$ of the redundancy circuit is turned off or, in other words, the repair operation is not activated and $\overline{X7R}$ is not selected. $\overline{RM}$ at node 46 is high, the other input at 56 to NAND gate 58 is also high, making the output of NAND gate 58 low at node 60, which is one input to NOR gate 62. During operation, the other input to NOR gate 62 at node 64, X7, is low, or selected. The output of NOR gate 62 at node 66 is high when the output at node 66 is high, the right hand block $\overline{X7R}$ is not selected. The value at node 60 also is fed through inverter 68 to become a high as one input to NAND gate 70. The other input to NAND gate 70 at node 72, not $\overline{X7}$ is high or not selected. As a result, the output of NAND gate 70 at node 74 is low when the output at node 74 is low $\overline{X7L}$ is selected.

In this embodiment, X7, $\overline{X7}$,$\overline{X7R}$ and $\overline{X7L}$ are selected when low and not selected when high. When $\overline{X7R}$ is selected, the lft block or spare cells are selected. Selection of $\overline{X7L}$ represents normal conditions when spare cells or the repair operation is not activated.

In the repair operation, as was previously described, the main wordline ($\overline{MWL}$) of the redundancy circuit is turned on, i.e., the main wordline repair is selected. The signal at node 46, $\overline{RM}$, is at the low level, or zero. With a high at node 56 and a low at node 46, the output of NAND gate 58, the value at node 60, becomes high. A high at node 60 combined with a low at node 64 when X7 is selected, forces the output of NOR gate 62 to go low or $\overline{X7R}$ is selected. Through inverter 68, one input to NAND gate 70 is low while the other from $\overline{X7}$ is high. Thus, the output of NAND gate 70 goes high, or the left hand block, $\overline{X7L}$, is not selected.

Through the use of the present invention, all spare cells may be placed on one block of memory cells in a static random access memory chip. This has the advantages of allowing a reduction in the size of the chip. Also, repair can be executed such that the repair yield can be increased.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

We claim:

1. An apparatus for effecting repair or replacement of defective circuits in a solid state memory chip includes locating all the spare cells on one block comprising:

a first logic means having a first input always receiving a high voltage signal and a second input receiving said high voltage signal whenever repair is not selected for providing a fist output whenever both inputs receive said high voltage signal and a second output at all other times;

a second logic means having a first input connected to said output of said first logic means and a second input receiving a low voltage signal when repair is indicated, said second logic means having a first output whenever one of the inputs receives said high voltage signal and a second output whenever neither input receives said high voltage signal; and a third logic means having a first input connected to said output of said first logic means through a circuit that inverts the value of said output from said first logic means and a second input receiving said high voltage signal when repair is indicated, said third logic means producing a first output whenever both inputs receive said high voltage signal and a second output at all other times.

2. The apparatus according to claim 1 wherein said first logic means includes a NAND gate.

3. The apparatus according to claim 1 wherein said second logic means includes a NOR gate.

4. The apparatus according to claim 1 wherein said third logic means includes an inverter and a NAND gate.

5. A system for effecting repair or replacement of defective circuits in a solid state memory chip comprising:

a memory chip having a fist block with only a group of mainline words and a second block with a group of mainline words and spare memory cells;

a circuit means for switching from mainline words to spare memory cells including a first logic means having a first input always receiving a high voltage signal and a second input receiving said high voltage signal whenever repair is not selected for providing a first output whenever both inputs receive said high voltage signal and a second output at all other times, a second logic means having a first input connected to said output of said first logic means and a second input receiving a low voltage signal when repair is indicated, said second logic means having a first output whenever one of the inputs receives said high voltage signal and a second output whenever neither input receives said high voltage signal, and a third logic means having a first input connected to said output of said first logic means through a circuit that inverts the value of said output from said first logic means and a second input receiving said high voltage signal when repair is indicated, said third logic means producing a first output whenever both inputs receive said high voltage signal and a second output at all other times.

6. The system according to claim 5 wherein said first logic means includes a NAND gate.

7. The system according to claim 5 wherein said second logic means includes a NOR gate.

8. The system according to claim 5 wherein said third logic means includes an inverter and a NAND gate.

9. An apparatus for effecting repair or replacement of defective circuits in a solid state memory chip includes locating all the spare cells on one block comprising:

first circuit means having a first input receiving a high voltage input whenever repair is not selected, said first circuit means for producing a first output whenever repair is not selected and a second output at all other times;

second circuit means having two inputs, one input connected to said first circuit means, said second circuit means producing a first output whenever no input is present and a second output whenever an input is present; and third circuit means having two inputs, one input connected to said first circuit means through a circuit that inverts the value of said output from said first circuit means, said third circuit means producing a first output whenever both inputs are present and a second output otherwise.

* * * * *